United States Patent [19]
Anthony et al.

[11] 3,977,910
[45] Aug. 31, 1976

[54] DEEP FINGER DIODES

[75] Inventors: Thomas R. Anthony; Harvey E. Cline, both of Schenectady, N.Y.

[73] Assignee: General Electric Company, Schenectady, N.Y.

[22] Filed: Jan. 30, 1975

[21] Appl. No.: 545,531

Related U.S. Application Data

[62] Division of Ser. No. 411,002, Dec. 14, 1973, abandoned.

[52] U.S. Cl. ................................ 148/1.5; 148/171; 148/172; 148/177; 148/179; 252/62.3 E; 252/62.3 GA; 357/20
[51] Int. Cl.² ..................................... H01L 7/34
[58] Field of Search ............ 148/1.5, 171, 172, 188, 148/177, 179; 252/62.3 GA, 62.3 E; 75/65 ZM

[56] References Cited

UNITED STATES PATENTS 2,813,048   11/1957   Pfann ..................................... 148/1

*Primary Examiner*—G. Ozaki
*Attorney, Agent, or Firm*—Donald M. Winegar; Joseph T. Cohen; Jerome C. Squillaro

[57] ABSTRACT

Deep finger diodes in a body of semiconductor material are fabricated by a thermal gradient zone melting process. A liquid wire or droplet is migrated into the body through one surface to a depth less than the thickness of the body. The migration of the liquid wire or droplet is reversed to remove the wire or droplet from the body leaving a recrystallized material of the body having solid solubility of a material therein.

25 Claims, 13 Drawing Figures

THERMAL GRADIENT DIRECTION

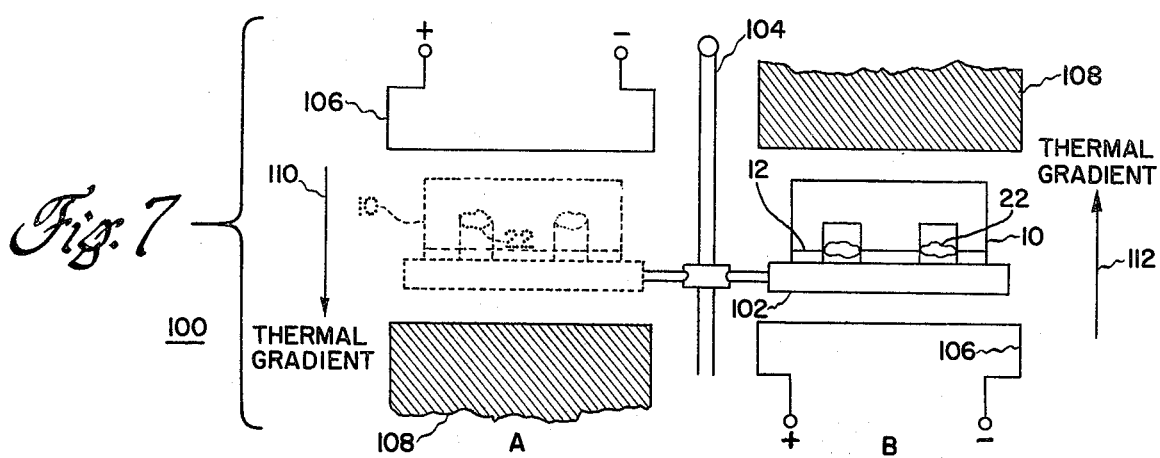
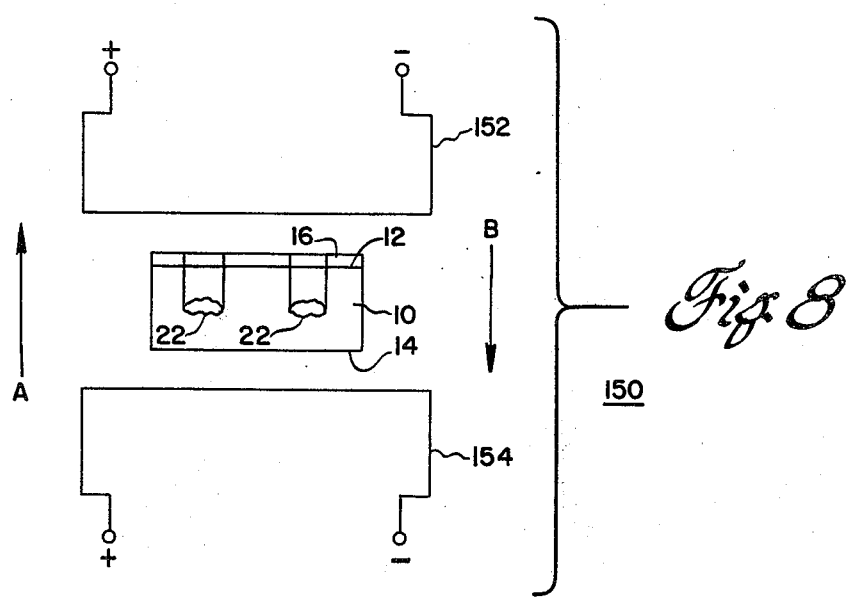
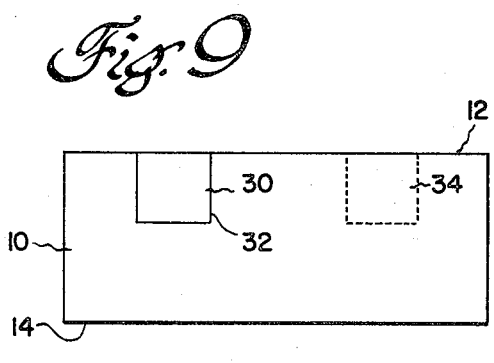
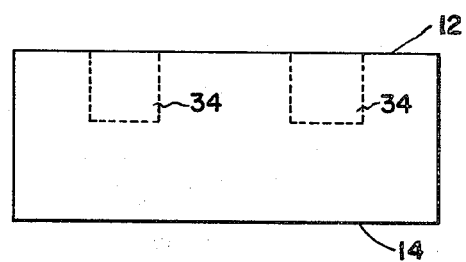

DEEP FINGER DIODES

This is a division of application Ser. No. 411,002, filed Dec. 14, 1973, now abandoned in favor of Ser. No. 559,262, filed Mar. 17, 1975.

BACKGROUND OF THE INVENTION

1. Field of the Invention

This invention relates to semiconductor diodes and arrays embodying the same.

2. Description of the Prior Art

Deep diodes are normally made by migrating a small metal-rich liquid droplet completely through a body of semiconductor material. For some device applications long narrow finger-like diodes tha extend only part way into a body are advantageous. To date, these finger diodes are normally made by diffusion. Consequently, the finger diode has a varying level of resistivity throughout its region. In addition, deep finger diodes fabricated by solid state diffusion involve extensive processing times at high temperatures with a resultant drop in device yield.

It is therefore an object of this invention to provide a new and improved finger diode which substantially corrects the deficiences of the prior art finger diodes.

Another object of this invention is to provide a finger diode in a body of semiconductor material which has a substantially uniform resistivity throughout the entire diode structure.

Another object of this invention is to provide a new and improved method for making a diode in a body of semiconductor material.

Other objects of this invention will, in part, be obvious, and will, in part, appear hereinafter.

BRIEF DESCRIPTION OF THE INVENTION

In accordance with this invention, there is provided a semiconductor device comprising a body of semiconductor material having two major opposed surfaces. The material of the body has a selective type conductivity and a selective resistivity. At least one region of recrystallized material is disposed in the body. Each region extends from one of the major surfaces into the body less than the thickness of the body and has an end surface coextensive with one of the major surfaces of the body. The material of the each region is recrystallized material of the body with solid solubility of material therein and having a selective resistivity and a type conductivity which is the same as, or opposite to that of, the material of the body. The regions may be formed through any of the major surfaces of the body by a temperature gradient zone melting process simultaneously or individually.

DESCRIPTION OF THE DRAWINGS

FIGS. 7 and 8 are schematics of alternate apparatus means for processing the body of semiconductor material in accordance with the teachings of this invention;

FIGS. 9, 10 and 11 are elevation views, in cross-section, of the alternate embodiments of the body of FIG. 5.

DESCRIPTION OF THE INVENTION

Figure 1:
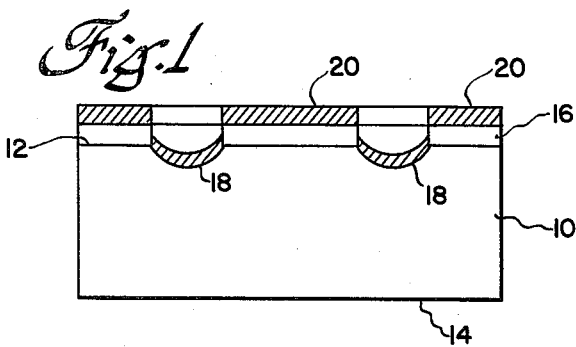
FIGS. 1 and 2 are elevation views, in cross-section, of a body of semiconductor material processed in accordance with the teachings of this invention.

With reference to FIG. 1, there is shown a body 10 of semiconductor material having a selected resistivity and a first type conductivity. The body 10 has opposed major surface 12 and 14 which are the top and bottom surfaces respectively thereof. The semiconductor material comprising the body 10 may be silicon, germanium, silicon carbide, gallium arsenide, a compound of a Group II element and a Group VI element, and a compound of a Group III and a Group V element.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 14 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80°C. A suitable mask defining one or more geometrical shapes such, for example, as a circle or a square is disposed on the layer of photoresist and exposed on ultraviolet light. After exposure, the layer of photoresist is washed in xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$—HF). The etching is continued until a second set of windows corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180°C or immersion in a solution of 1 part of hydrogen peroxide and 1 part of concentrated sulphuric acid immediately after mixing.

Selective etching of the exposed surface of areas of body 10 is accomplished with a mixed acid solution. The mixed acid solution is 10 parts by volume nitric acid 70%, 4 parts by volume acetic acid, 100%, and 1 part by volume hydrofluoric acid, 48%. At a temperature of from 20°C to 30°C, the mixed acid solution selectively etches the silicon of the body 10 at a rate of approximately 5 microns per minute. A depression 18 is etched in the surface 12 of the body 10 beneath each window of the oxide layer 16. The selective etching is continued until the depth of the depression 18 is approximately equal to the width of the window in the silicon oxide layer 16. However, it has been discovered, that the depression 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25°C will result in a depression 18 of from 25 to 30 microns in depth for a window or diameter of from 10 to 500 microns. The etched body 10 is rinsed in distilled water and blown dry. Preferably, a gas such, for example, as freon, argon and the like, is suitable for drying the processed body 10.

The processed body 10 is disposed in a metal evaporation chamber. A mass of a selective metal is formed on selected surface areas of the surface 12 by depositing a metal layer 20 on the remaining portions of the layer 16 of silicon oxide and on the exposed silicon in the depressions 18. The metal in the depressions 18 are the metal droplets to be migrated into and then out of the body 10. The metal of the layer 20 comprises a material, either substantially pure in itself or suitably doped by one or more materials to impart a second and opposite type conductivity to the materials of the body 10 through which it migrates. The thickness of the layer 20 is approximately equal to the depth of the depressions 18 which is preferably 20 microns deep. Therefore, the layer 20 is approximately 20 microns in thickness. A suitable material for the metal layer 20 is aluminum to obtain P-type regions in N-type silicon semiconductor material. Prior to migrating the metal droplet or droplets in the depressions 18 through the body of silicon 10, the excess metal of the layer 20 is removed from the silicon oxide layer 16 by such suitable means as grinding away the excess metal with a 600 grit carbide paper or by selective etching.

It has been discovered that the vapor deposition of the layer 20 of aluminum metal should be performed at a pressure of approximately $1 \times 10^{-5}$ torr but not less than $5 \times 10^{-5}$ torr. When the pressure is less than $3 \times 10^{-5}$ torr, we have found that in the case of aluminum metal deposited in the depression 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the silicon body 10 are by the electron beam method and the like wherein little if any oxygen can be trapped in the aluminum.

Figure 2:
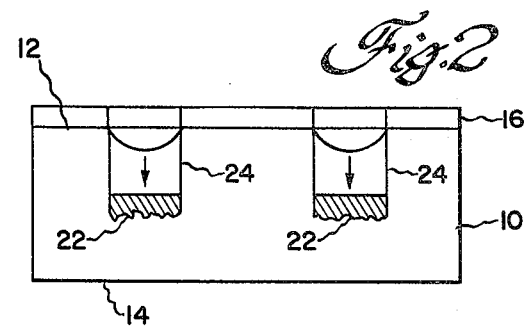

Referring now to FIG. 2, the processed body 10 is placed in a migration apparatus, not shown, and the metal in the depressions 18 forms a droplet 22 of metal-rich alloy of the material of the body 10 in each etched area of surface 12 and is migrated through the body 10 by a termal gradient zone melting process. A thermal gradient of approximately 50°C per centimeter between the bottom surface 14, which is the hot face, and the surface 12, which is the cold face, has been discovered to be appropriate for an average temperature of the body 10 of from 700°C to 1350°C. The process is practiced for a sufficient length of time preferably in an inert atmosphere of hydrogen, helium, argon and the like to migrate the metal-rich droplet 22 through the body 10 to a predetermined depth beneath the surface 12. For example, for aluminum metal of 20 microns thickness, a thermal gradient of 50°C/centimeter, a temperature of the body 10 of 1100°C, a furnace time of less than 15 minutes is required to migrate the metal-rich droplet 22 into a silicon body 10 to a depth of 4 mils beneath the surface 12 to form a region 24 of recrystallized semiconductor material of the body 10 having said solubility of the metal 22 therein.

Figure 3:
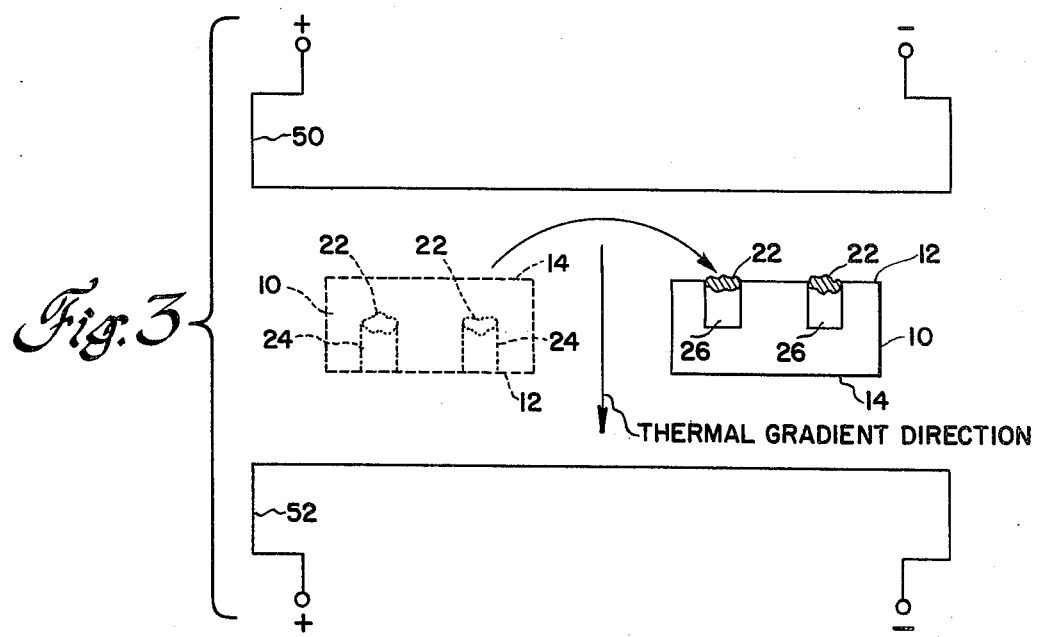
FIG. 3 is a schematic of apparatus suitable for processing the body of FIGS. 1 and 2.
Figure 4:
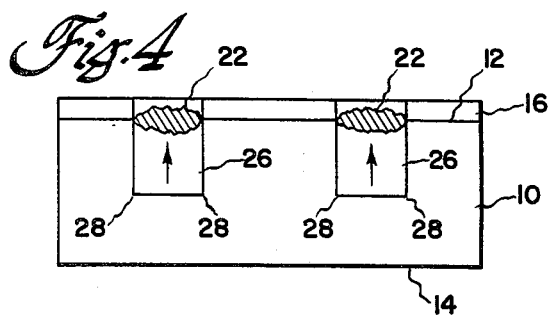
FIGS. 4 through 6 are views, in cross-section, of the body of FIGS. 1 and 2 processed further in accordance with the teachings of this invention.
Figure 5:
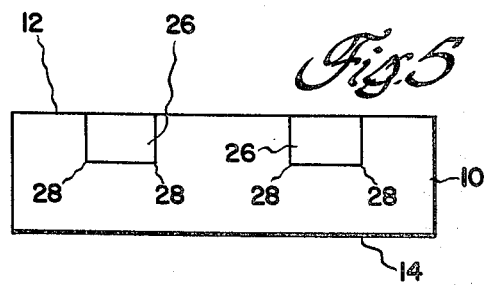

Upon reaching the desired depth beneath the surface 12, the thermal gradient is reversed to migrate the remainder of the metal-rich droplet 22 from the body 10. There are several methods by which the second, or reversed thermal migration of the metal droplet 22 may be practiced. With reference to FIG. 3, there is shown a schematic of an arrangement for the migration of one or more metal-rich droplets 22 in a body 10 of semiconductor material. Migration of the droplet 22 in accordance with the teachings of this invention, is practiced wherein suitable means such, for example as a pair of controlled resistive tungsten heaters 50 and 52 are adjusted to establish the thermal gradient necessary to thermomigrate the droplet 22. Upon reaching the prescribed depth D of the migration of the droplet 22, while still maintaining the thermal gradient, the processed body 10 is turned over. The thermal gradient is now reversed with respect to the body 10. The droplet 22 is migrated from the interior of the body 10 to the surface 12. The body 10 is processed as shown in FIG. 4. The excess metal is removed from the surface 12 and the surface 12 etched and polished to remove damaged material for further processing of the body 10. Care is exercised to assure one that region 26 coincides with region 24. Region 26 is slightly larger than region 24 but the overall change is insignificant. The processed body 10 is as shown in FIG. 5.

The initial migration of the droplet 22 formed a region 24 of recrystallized material of the body 10 having solid solubility of the metal 16 therein. The conductivity type of the material of the region 24 may be the same as that of the body 10 or of a different and opposite type thereby forming a P-N junction by the contiguous surfaces of the materials of opposite type conductivity. The resistivity of the region 24 is dependent on the migrated grated through the body 10. The second migration of the droplet 22 forms a region 26 of recrystallized material of the region 24. The material is substantially the same as that of the region 24.

Figure 6:
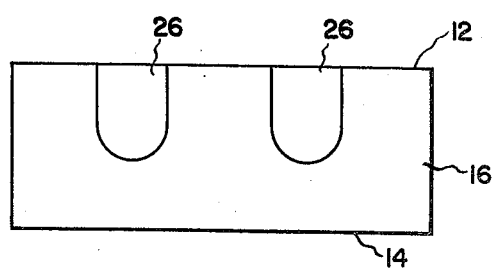

The process of forming the region 26 produces regions of enhanced electrical fields at the corners 28 thereof which may cause premature breakdown of any P-N junction formed in the body 10 by the region 26 of a line of demarcation between the materials of the body 10 and the region 26. The body 10 may be heated to an elevated temperature sufficient to diffuse the dopant of the region 26 and grade the P-N junction profile rounding off the corners and reducing the area with the enhanced electric field. The final structure is as shown in FIG. 6.

Referring now to FIG. 7, there is shown a schematic of a second apparatus 100 which is suitable for processing the body 10 of this invention. In position A of the apparatus 100, the body 10 is prepared for migration and disposed on a sample holder 102 affixed to and rotable in a horizontal plane perpendicular to a vertical shaft 104. Suitable heating and cooling means such, for example, as a resistive tungsten heater 106 and a water cooled block 108 establish a thermal gradient in the body 10 in the direction of the arrow 110. The metal droplet 22 is migrated to the appropriate depth and then rotated about the shaft 104 to position B.

In position B, a thermal gradient apparatus the same as, or similar to those of Position A, produces a thermal gradient in the direction of the arrow 112. The droplet 22 is migrated to the surface 12 for removal.

A third apparatus 150 suitable for processing the body 10 in accordance with the teachings of this invention is shown in FIG. 8. Suitable heating elements 152 and 154 such for example as resistive tungsten heaters are controlled to produce a thermal gradient in direction A first and then in a reversed direction B. The processed body 10 is again as shown in FIG. 5.

The material of the metal droplet 22 should not be allowed to solidify within the body 10. Solidification of the droplet 22 with the body 10 may cause severe internal stresses, even fractures of the materials which detrimentally affects the physical characteristics of the body 10. Complete failure of the processed body 10 is possible.

It has been discovered that when the body 10 is of silicon, germanium, silicon carbide, gallium arsenide semiconductor material and the like, the migrating metal droplet 22 has a preferred shape which also gives use to the region 26 being of the same shape as the migrating droplet 22. In a crystal axis direction <111> of thermal migration, the droplet 22 migrates as a triangular platelet laying in a (111) plane. The platelet is bounded on its edges by (11$\bar{2}$) planes. A droplet 22 larger than 0.10 centimeter on an edge is unstable and breaks up into several droplets during migration. A droplet 22 smaller than 0.0175 centimeter does not migrate into the body 10 because of a surface barrier problem.

The ratio of the droplet migration rate over the imposed thermal gradient is a function of the temperature at which migration of the droplet 22 is practiced. At high temperatures, of the order of from 1050° to 1400°C, the droplet migration velocity increases rapidly with increasing temperature. A velocity of 10 centimeters per day or $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreases by a factor of 200.

A droplet 22 migrates in the <100> crystal axis direction as a pyramid bounded by four forward (111) planes and a rear (100) plane. Careful control of the thermal gradient and migration rate is a necessity. Otherwise, a twisted region 26 may result. It appears that there is a non-uniform dissolution of the four forward (111) facets in that they do not always dissolve at a uniform rate. Non-uniform dissolution of the four forward (111) facets may cause the regular pyramidal shape of the droplet to become distorted into a trapezoidal shape.

For a more thorough understanding of the temperature gradient zone melting process and the apparatus employed for the process, one is directed to our copending applications entitled Method of Making Deep Diode Devices, U.S. Pat. No. 3,901,736, issued Aug. 26, 1975 High Velocity Thermomigration Method of Making Deep Diodes, U.S. Pat. No. 3,910,801, issued Oct. 7, 1975 Deep Diode Devices and Method and Apparatus, Ser. No. 416,001, filed Oct. 30, 1973 (now abandoned); High Velocity Thermomigration Method of Making Deep Diodes, U.S. Pat. No. 3,898,106, issued Aug. 5, 1975; Deep Diode Device and Method, U.S. Pat. No. 3,902,925, issued Sept. 2, 1975 and Stabilized Droplet Method of Making Deep Diodes Having Uniform Electrical Properties, U.S. Pat. No. 3,899,361, issued Aug. 12, 1975 filed concurrently with this patent application and assigned to the same assignee of this invention.

The regions of recrystallized material exhibit substantially theoretical physical values which are dependent upon the materials involved. Various materials may be migrated into the body 10 to provide various configurations therein. As shown in FIG. 9, the material of the body 10 may be of a first type conductivity, a selected resistivity, such, for example, as N-type silicon of 10 ohm-centimeters. A region 30 of P-type conductivity may be found in the body 10 in accordance with the process of this invention. If the metal 16 is aluminum, the resistivity of the region 30 is $8 \times 10^{-3}$ ohm-centimeter and a P-N junction 32 is formed by the contiguous surfaces of the two opposite type conductivity materials. Such a configuration may be utilized to form a diode in the body 10. If the material migrated is also N-type, a region 34 is formed. The region 34 may have a different resistivity such, for example as $2 \times 10^{-2}$ ohm-centimeter when the metal migrated is 3% antimony and the remainder is gold. Such a configuration may be utilized as a sinker to achieve a low electrical conductivity path to a region deep in the body 10.

Figure 11:
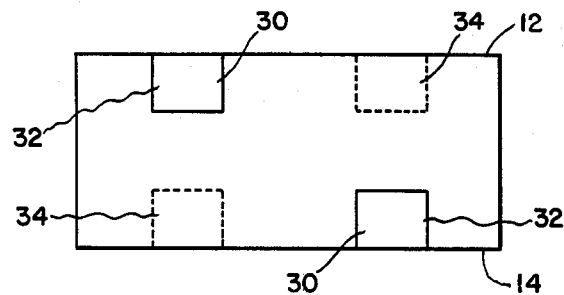

Alternatively, as shown in FIG. 10, a plurality of regions 34 may be formed in the body 10. As shown in FIG. 11, a plurality of the two regions 30 and 34 may also be formed in the body 10.

Although the invention has been described for the migration of metal droplets through a body of semiconductor material, the same process is practiced wherein the regions 24, 26, 30 and 34 may have a planar configuration. The planar configurations are achieved by migrating metal "wires". The depressions 18 are configured into trough-like depressions and the metal wire deposited therein. The preferred planar orientations for the surfaces 12 and 14, the preferred wires directions and the corresponding preferred directions of migration are as shown in the Table.

Table

| Wafer Plane | Migration Direction | Stable Wire Directions | Stable Wire Sizes |
|---|---|---|---|
| (100) | <100> | <011>* | <100 microns |
|  |  | <0$\bar{1}$1>* | <100 microns |
| (110) | <110> | <110>* | <150 microns |
| (111) | <111> | a) <011 > |  |
|  |  | <101> | <500 microns |
|  |  | <110> |  |
|  |  | b) <112>* |  |
|  |  | <211>* | <500 microns |
|  |  | <121>* |  |
|  |  | c) Any other* Direction in (111) plane* | <500 microns |

*The stability of the migrating wire is sensitive to the alignment of the thermal gradient with the <100>, <110> and <111> axis, respectively.
+Group a is more stable than group b which is more stable than group c.

It has also been discovered that the migration of droplets and metal wires may be practiced in an inert gas atmosphere at a positive pressure wherein the body of semiconductor material is a thin wafer of the order of 10 mil thickness. Lack of control of lateral thermal gradients does not appear to appreciably affect the process apparently because of the large ratio of planar surface area to side surface area.

Figure 12:
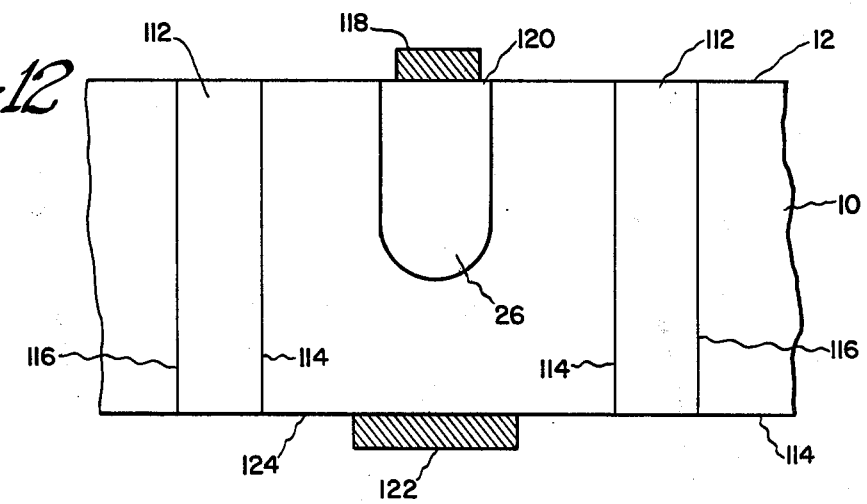
FIGS. 12 and 13 are elevation views, in cross-section, of alternate embodiments of the invention.

Referring now to FIG. 12, there is shown a semiconductor device 110 embodying the processed body 10 of this invention in an integrated circuit configuration. The reference numerals which are the same as previously employed with reference to FIGS. 1 through 10 denote the same items which are the same, and perform in the same manner, as previously described.

Figure 13:
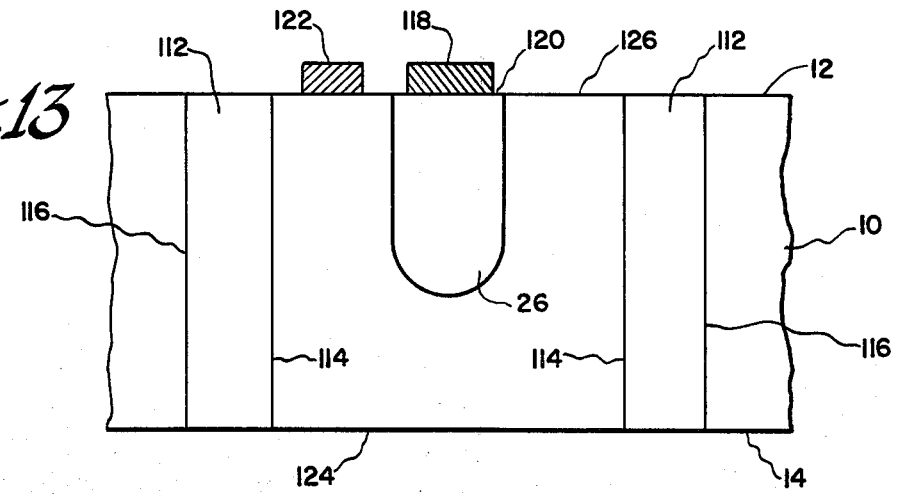

The body 10 is further processed by forming an isolation region 112 in the body 10. The region 112 is fabricated by the temperature gradient zone melting process described heretofore. The region 112 has the same conductivity type as the region 26. P-N junctions 114 and 116 are formed by the contiguous surfaces of the regions 112 and the respective portions of the body 10. The region 112 may have a cylindrical, a rectangular or a square configuration or be two plannar regions extending the full width of the body 10. The region 112 electrically isolates the region 26, a diode, from the remainder of the body 10. An electrical contact 118 is affixed to the surface area 120 of the region 26 coextensive with the surface 12 of the body. An electrical contact 122 is affixed to that surface portion 124 of the surface 14 of the body 10 defined by the regions 112 intersecting the surface 14. Alternatively, as shown in FIG. 13, the contact 122 may be affixed to the surface 126 of the body 10 defined by the region 112 intersecting the surface 12.

We claim as our invention:

1. A process for making a semiconductor device comprising the process steps of:
   a. selecting a body of semiconductor material having a predetermined leverl of resistivity, a predetermined type conductivity and two major opposed surfaces which are, respectively, the top and bottom surfaces thereof, at least one of the major surfaces having a preferred planar crystal structure orientation, and a vertical axis of the body being substantially aligned parallel with a first axis of the crystal structure which is substantially perpendicular to at least the major surface having the preferred planar orientation;
   b. selectively etching a selective portion of the at least one major surface having a preferred crystal planar orientation to form depressions therein having a preferred geometric configuration;
   c. vapor depositing a layer of metal of a preferred thickness in each depression;
   d. forming a melt of the metal and a portion of the semiconductor material of the body in contact therewith on the major surface of the body;
   e. establishing a first thermal gradient substantially parallel with the vertical axis and the first crystal axis of the body;
   f. migrating each melt into the body a predetermined distance in the direction of the higher temperature of the thermal gradient from the one major surface less than the distance between the two major opposed surfaces to form a first region of recrystallized semiconductor material of the body having solid solubility of the selective metal therein;
   g. establishing a second thermal gradient substantially parallel with the vertical axis and the first crystal axis of the body, and
   h. migrating each melt from that point within the body wherein the melt had migrated to that major opposed surface from which the melt had initially been migrated therefrom to form a second region of recrystallized material of the the first region and having solid solubility of the deposited metal therein of a predetermined concentration sufficient to impart a second and opposite type conductivity thereto than that of the body and also forming a P-N junction at the contiguous surfaces of the material comprising respectively the second region and the body.

2. The process for making the semiconductor device of claim 1 including the additional process step of:
   heat treating the body of semiconductor material to stress relieve at least that portion of the P-N junction formed therein in the vicinity of that point where the second migration of the melt was initiated.

3. The process of claim 1 wherein
   the method employed to deposit the method produces a mass of substantially oxygen free metal.

4. The process of claim 1 wherein
   the at least one of the major surfaces has a preferred planar crystal orientation of (111), and
   the first crystal axis of the body is <111>.

5. The process of claim 4 wherein
   the material of the body is silicon, silicon carbide, germanium and gallium arsenide.

6. The process of claim 4 wherein
   the material of the body is silicon of N-type conductivity, and
   the metal which has solid solubility in the recrystallized silicon is aluminum.

7. The process of claim 4 wherein
   each depression has a preferred configuration of a "wire" which has a preferred second crystal axis direction which is at least one selected from the group consisting of $<01\bar{1}>$, $<10\bar{1}>$ and $<1\bar{1}0>$.

8. The process of claim 7 wherein
   the material of the body is silicon, silicon carbide, germanium and gallium arsenide.

9. The process of claim 8 wherein
   the material of the body is silicon of N-type conductivity, and
   the solid solubility metal in the recrystallized silicon is aluminum.

10. The process of claim 4 wherein
    each depression has a preferred configuration of a "wire" and a preferred second crystal axis direction which is at least one selected from the group consisting of $<11\bar{2}>$, $<\bar{2}11>$ and $<1\bar{2}1>$.

11. The process of claim 10 wherein
    the material of the body is silicon, silicon carbide, germanium and gallium arsenide.

12. The process of claim 11 wherein
    the material of the body is silicon of N-type conductivity, and
    the solid solubility metal in the recrystallized silicon is aluminum.

13. The process of claim 4 wherein
    at least one depression has a configuration of a wire and a width suitable to form a stable wire of less than 500 microns in width for migration.

14. The process of claim 4 wherein
    each depression has a second preferred crystal axis direction which is at least one selected from the group consisting of $<01\bar{1}>$, $<10\bar{1}>$, $<1\bar{1}0>$, $<11\bar{2}>$, $<\bar{2}11>$ and $<1\bar{2}1>$.

15. The process of claim 1 wherein
    the at least one of the major surfaces has a preferred planar crystal orientation of (100), and
    the first crystal axis of the body is <100>.

16. The process of claim 15 wherein
    the material of the body is silicon, silicon carbide, germanium and gallium arsenide.

17. The process of claim 16 wherein the material of the body is silicon of N-type conductivity, and the solid solubility metal in the recrystallized silicon is aluminum.

18. The process of claim 15 wherein each depression of metal has a preferred linear configuration of a wire oriented in a preferred second crystal axis direction which is at least one selected from the group consisting of <011> and <0$\bar{1}$1>.

19. The process of claim 18 wherein the material of the body is silicon, silicon carbide, germanium and gallium arsenide.

20. The process of claim 19 wherein the material of the body is silicon of N-type conductivity, and the solid solubility metal in the recrystallized silicon is aluminum.

21. The process of claim 18 wherein each depression which has a wire-like configuration has a width suitable to form a stable wire of less than 100 microns in width for migration.

22. The process of claim 1 wherein the at least one of the opposed major surface has a preferred planar crystal orientation of (110);

each depression has a preferred linear configuration of a wire and a second preferred crystal axis direction of <1$\bar{1}$0>, and the first crystal axis of the body is <110>.

23. The process of claim 22 wherein the material of the body is silicon, silicon carbide, germanium and gallium arsenide.

24. The process of claim 23 wherein the material of the body is silicon of N-type conductivity, and the solid solubility metal in the recrystallized silicon is aluminum.

25. The process of claim 22 wherein each depression which has a wire-like configuration has a width suitable to form a stable wire of less than 150 microns in width for migration.

* * * * *